(12) United States Patent
Miu et al.

(10) Patent No.: US 8,754,450 B2
(45) Date of Patent: Jun. 17, 2014

(54) SIGE HETEROJUNCTION BIPOLAR TRANSISTOR HAVING LOW COLLECTOR/BASE CAPACITANCE AND MANUFACTURING METHOD OF THE SAME

(75) Inventors: Yan Miu, Shanghai (CN); Changwa Yao, Shanghai (CN); Hu Peng, Shanghai (CN)

(73) Assignee: Shanghai Hua Hong Nec Electronics Co., Ltd., Shanghai (CN)

(*) Notice: Subject to any disclaimer, the term of this patent is extended or adjusted under 35 U.S.C. 154(b) by 7 days.

(21) Appl. No.: 13/280,226

(22) Filed: Oct. 24, 2011

(65) Prior Publication Data

US 2012/0098039 A1    Apr. 26, 2012

(30) Foreign Application Priority Data

Oct. 25, 2010   (CN) .......................... 2010 1 0517831

(51) Int. Cl.
*H01L 29/737*     (2006.01)
*H01L 21/331*     (2006.01)

(52) U.S. Cl.
USPC ........................................ 257/197; 438/318

(58) Field of Classification Search
USPC .................... 257/197, 183; 438/312
See application file for complete search history.

(56) References Cited

U.S. PATENT DOCUMENTS

| | | | | |
|---|---|---|---|---|
| 6,462,397 B2* | 10/2002 | Ryum et al. | .................. | 257/565 |
| 6,506,656 B2* | 1/2003 | Freeman et al. | .............. | 438/309 |
| 7,384,869 B2* | 6/2008 | Riley et al. | .................... | 438/689 |
| 7,803,685 B2* | 9/2010 | John et al. | ..................... | 438/312 |
| 7,863,141 B2* | 1/2011 | Liu | ............................... | 438/285 |

* cited by examiner

*Primary Examiner* — Zandra Smith
*Assistant Examiner* — Damon Hillman
(74) *Attorney, Agent, or Firm* — Blakely Sokoloff Taylor & Zafman

(57) ABSTRACT

A SiGe HBT having low collector-base capacitance is disclosed, which includes: a silicon substrate, including isolation trenches, a collector region situated between the isolation trenches, and lateral trenches; a SiGe base layer formed on the silicon substrate; and an emitter region formed on the SiGe base layer. Each lateral trench is situated in the collector region on one side of an isolation trench, and is connected to the isolation trench. Moreover, a manufacturing method of a SiGe HBT having low collector-base capacitance is disclosed, which includes: performing ion implantation to predetermined regions in a silicon substrate before trench isolations are formed; forming lateral trenches by etching ion implantation regions after the trench isolations are formed; then forming a SiGe HBT device by an ordinary semiconductor process. The present invention can reduce the collector-base capacitance and therefore improve high-frequency characteristics of the device.

11 Claims, 5 Drawing Sheets

_US 8,754,450 B2_

SIGE HETEROJUNCTION BIPOLAR TRANSISTOR HAVING LOW COLLECTOR/BASE CAPACITANCE AND MANUFACTURING METHOD OF THE SAME

CROSS-REFERENCES TO RELATED APPLICATIONS

This application claims the priority of Chinese patent application number 201010517831.8 filed on Oct. 25, 2010, the entire contents of which are incorporated herein by reference.

TECHNICAL FIELD

The present invention relates to a semiconductor device structure and specifically relates to a structure of a silicon-germanium heterojunction bipolar transistor (SiGe HBT), especially to a SiGe HBT having low collector-base capacitance. Moreover, the present invention also relates to a manufacturing method of a SiGe HBT having low collector-base capacitance.

BACKGROUND OF THE INVENTION

Silicon-germanium (SiGe) has become another important semiconductor material other than silicon (Si) and gallium arsenide (GaAs). SiGe has more excellent properties than pure Si material, and the production processes of SiGe are compatible with Si processes. SiGe HBT has electrical properties which are almost in the same level as those of the same kind of devices made of compound semiconductor material like GaAs. The SiGe HBT has a broad application prospect in RF (radio-frequency), especially in ultra-high frequency field. Moreover, the SiGe HBT can be integrated with CMOS process, which gives full play to the advantages of CMOS process in high integration and low cost and meanwhile realizes high-frequency and low-noise properties of SiGe/Si HBT.

However, a SiGe HBT or a BiCMOS could have some parasitic effects such as collector-substrate and collector-base capacitances, which could harm the high-frequency characteristics of the device. Therefore, reduction of parasitic capacitances will contribute to the improvement of properties of HBT devices.

SUMMARY OF THE INVENTION

An objective of the present invention is to provide a SiGe HBT structure having low collector-base capacitance which can reduce the collector-base capacitance and improve the high-frequency performance of the device. Moreover, the present invention is also to provide a manufacturing method of a SiGe HBT having low collector-base capacitance.

To achieve the above objective, the present invention provides a SiGe HBT having low collector-base capacitance, which comprises:

a silicon substrate comprising isolation trenches, a collector region situated between the isolation trenches, and lateral trenches;

a SiGe base layer formed on the silicon substrate; and an emitter region formed on the SiGe base layer, the emitter region comprising an emitter window;

wherein the SiGe base layer comprises an intrinsic base region and an extrinsic base region, wherein a part of the SiGe base layer at bottom of the emitter window of the emitter region is the intrinsic base region; the other part of the SiGe base layer excluding the intrinsic base region is the extrinsic base region;

wherein each lateral trench is situated in the collector region and below the extrinsic base region, and is connected to the isolation trench.

The lateral trenches are filled with a certain amount of oxide film, and are not fully filled with the oxide film; or the lateral trenches are fully filled with the oxide film.

Moreover, the present invention also provides a manufacturing method of a SiGe HBT having low collector-base capacitance, which comprises:

1) performing ion implantation to predetermined implantation regions in a on substrate.

2) depositing a bottom oxide layer, a nitride film and a top oxide layer successively on the silicon substrate as hard mask.

3) forming hard mask windows for trench isolation regions by etching the top oxide layer, the nitride film and the bottom oxide layer.

4) depositing first oxide film and forming oxide spacers in the hard mask windows through an etch-back process.

5) forming isolation trenches by dry etching the silicon substrate, each isolation trench being connected to one implantation region.

6) forming lateral trenches by etching the implantation regions.

7) removing the top oxide layer and the oxide spacers.

8) forming pad oxide layers in the isolation trenches and the lateral trenches.

9) filling second oxide film into the isolation trenches and then removing the nitride film and the bottom oxide layer on the surface of the silicon substrate.

10) depositing a first dielectric film and forming a base window in the first dielectric film, and performing epitaxial deposition of a base SiGe film.

11) depositing a second dielectric film and forming an emitter window in the second dielectric film.

12) depositing an emitter polysilicon.

13) forming a final silicon-germanium heterojunction bipolar transistor by etching the emitter polysilicon.

In step 1), the ion implantation is performed using arsenic ions with an implantation dose of 7~9E15 $cm^{-2}$; the implantation regions are below the extrinsic base region of the device; the implantation regions have a width smaller than that of the extrinsic base region and a depth of 0.1 μm~2 μm.

In step 2), the bottom oxide layer is deposited through a thermal oxidation process with a thickness of 80 Å~200 Å; the nitride film is deposited through a low pressure chemical vapor deposition process with a thickness of 300 Å~1000 Å, 4 times of that of the bottom oxide layer; the top oxide layer is deposited through a low pressure chemical vapor deposition process or sub-atmospheric pressure chemical vapor deposition process with a thickness of 1000 Å~10000 Å.

In step 4), the thickness of the oxide spacers is 100 Å.

In step 5), the isolation trenches have a depth of 3000 Å~8000 Å and a width of 1000 Å~4000 Å.

In step 6), the lateral trenches are formed through hot phosphoric acid wet etching at an etching rate of 20 Å/min~40 Å/min and an etching temperature of 150° C.~170° C.

In step 7), the top oxide layer and oxide spacers are removed by wet etching.

In step 8), the pad oxide layers are formed in the isolation trenches and the lateral trenches through a thermal oxidation process, and have a thickness of 100 Å~1000 Å.

In step 9), the second oxide film is filled into the isolation trenches through a high density plasma chemical vapor deposition process, and then the nitride film and the bottom oxide layer on the surface of the silicon substrate are removed by wet etching.

In step 11), a SiGe intrinsic base region and a SiGe extrinsic base region are formed accompanied with the formation of the emitter window; the SiGe intrinsic base region is a part of the base region at the bottom of the emitter window and the SiGe extrinsic base region is the other parts of the base region excluding the intrinsic base region.

Compared to the prior arts, the present invention has beneficial effects as follows:

Through performing ion implantation to a predetermined region of a silicon substrate before trench isolations are formed; forming lateral trenches by etching the ion implantation regions after the trench isolations are formed, and then forming a SiGe HBT device through an ordinary semiconductor process; the final HBT structure of the present invention has cavities (i.e. the lateral trenches) or cavities filled with a certain amount of oxide film. The structure can reduce the collector-base capacitance and improve the high-frequency performance of the device, by using the cavities or the cavities filled with a certain amount of oxide film instead of ordinary Si.

wherein, 10 indicates silicon substrate; 11 indicates implantation regions; 12 indicates lateral trenches; 13 indicates pad oxide layers; 14 indicates isolation trenches; 15 indicates SiGe intrinsic base region; 16 indicates SiGe extrinsic base region; 21 indicates bottom oxide layer; 22 indicates nitride film; 23 indicates top oxide layer; 24 indicates oxide spacers; 25 indicates first dielectric film; 26 indicates base SiGe film; 27 indicates second dielectric film; 28 indicates emitter polysilicon.

DETAILED DESCRIPTION OF THE INVENTION

The present invention will be further described and specified by drawings and embodiments in details.

Figure 1:
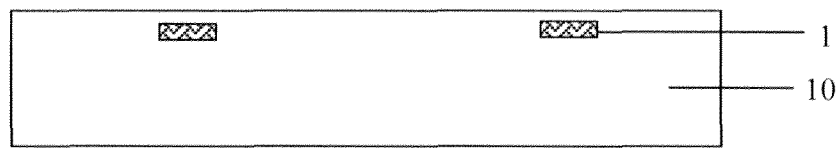
FIG. 1 illustrates the structure after the step 1) of the manufacturing method of an embodiment of the present invention is completed.

As shown in FIG. 1~13, the manufacturing method of a SiGe HBT having low collector-base capacitance of an embodiment of the present invention comprises the following steps:

1) performing ion implantation to predetermined implantation regions 11 in a silicon substrate, as shown in FIG. 1; the ion implantation is performed using arsenic ions with an implantation dose of 7~9E15 $cm^{-2}$; the implantation regions 11 are below the extrinsic base region of the device; the implantation regions 11 have a width smaller than that of the extrinsic base region and a depth (a distance between the surface of the implantation region and the surface of the substrate) of 0.1 μm~2 μm.

Figure 2:
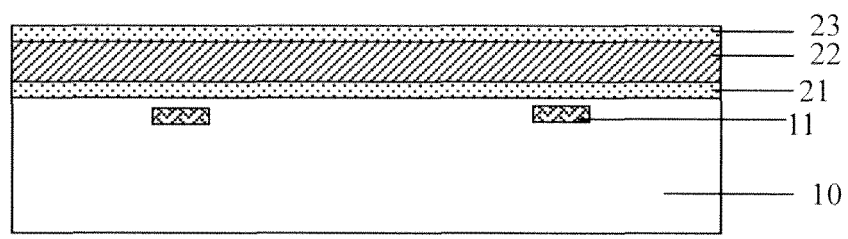
FIG. 2 illustrates the structure after the step 2) of the manufacturing method of an embodiment of the present invention is completed.

2) depositing a bottom oxide layer 21, a nitride film 22 and a top oxide layer 23 successively on the silicon substrate 10 as hard mask, as shown in FIG. 2; the bottom oxide layer 21 is deposited through a furnace thermal oxidation process with a thickness of 80 Å~200 Å; the nitride film 22 is deposited through a LPCVD (low pressure chemical vapor deposition) process with a thickness of 300 Å~1000 Å, 4 times of that of the bottom oxide layer 21; the top oxide layer 23 is deposited through a LPCVD process or SACVD (sub-atmospheric pressure chemical vapor deposition) process with a thickness of 1000 Å~10000 Å.

Figure 3:
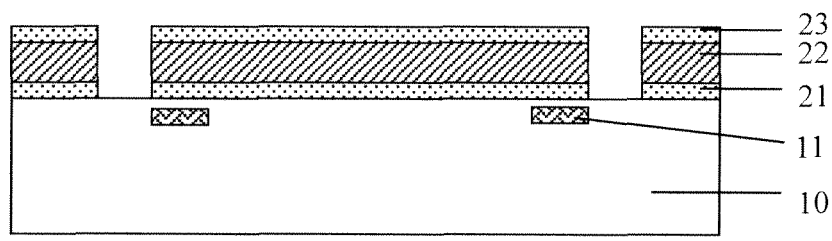
FIG. 3 illustrates the structure after the step 3) of the manufacturing method of an embodiment of the present invention is completed.

3) forming hard mask windows for trench isolation regions through an ordinary photolithography and etching process to etch the top oxide layer 23, the nitride film 22 and the bottom oxide layer 21, as shown in FIG. 3. One side of the hard mask window aligns with one side of the implantation region 11.

Figure 4:
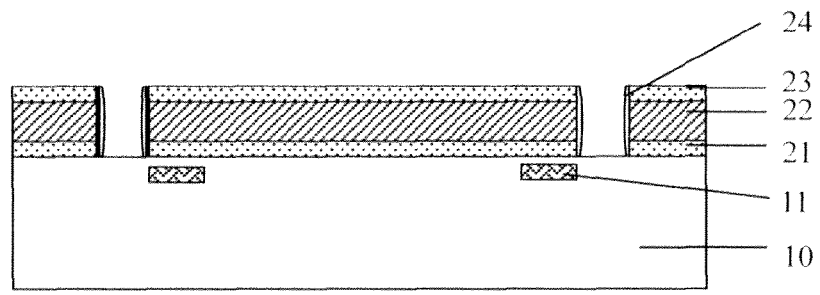
FIG. 4 illustrates the structure after the step 4) of the manufacturing method of an embodiment of the present invention is completed.

4) depositing first oxide film and forming oxide spacers 24 in the hard mask windows through an etch-back process, as shown in FIG. 4; the thickness of the oxide spacers 24 is 100 Å.

Figure 5:
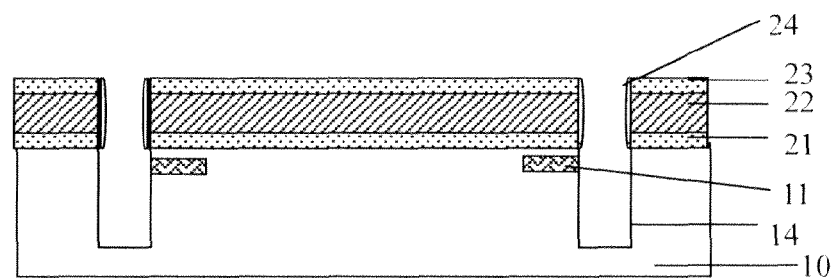
FIG. 5 illustrates the structure after the step 5) of the manufacturing method of an embodiment of the present invention is completed.

5) forming isolation trenches 14 by dry etching the silicon substrate 10, each isolation trench 14 being connected to one implantation region 11, as shown in FIG. 5; the isolation trenches 14 have a depth of 3000 Å~8000 Å and a width of 1000 Å~4000 Å.

Figure 6:
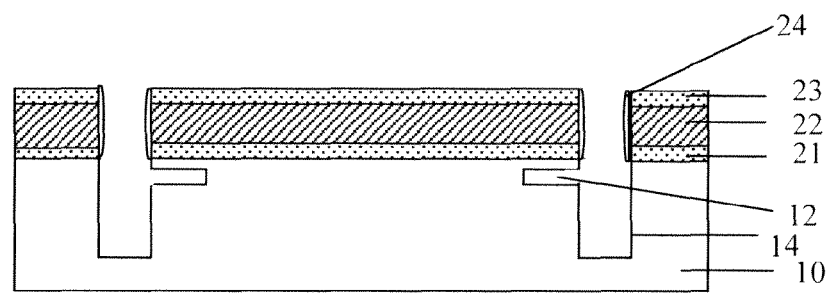
FIG. 6 illustrates the structure after the step 6) of the manufacturing method of an embodiment of the present invention is completed.

6) forming lateral trenches 12 by etching the implantation regions 11, as shown in FIG. 6; the lateral trenches 12 are formed through hot phosphoric acid wet etching process at an etching rate of 20 Å/min~40 Å/min (e.g. 30 Å/min) and an etching temperature of 150° C.~170° C. (e.g. 160° C.); this step comprises merely etching the implantation regions 11, yet hardly etching other regions.

Figure 7:
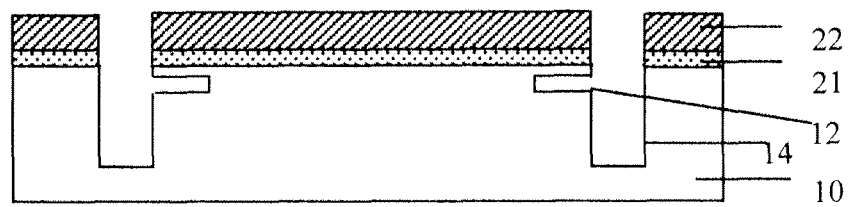
FIG. 7 illustrates the structure after the step 7) of the manufacturing method of an embodiment of the present invention is completed.

7) removing the top oxide layer 23 and the oxide spacers 24 by wet etching, as shown in FIG. 7.

Figure 8:
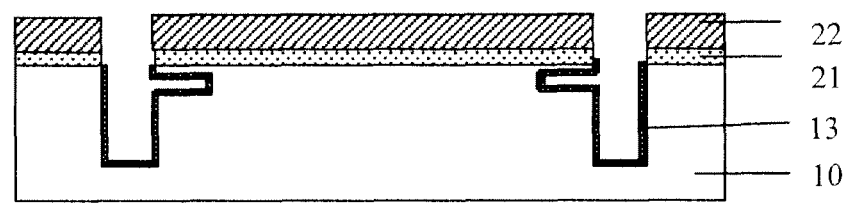
FIG. 8 illustrates the structure after the step 8) of the manufacturing method of an embodiment of the present invention is completed.

8) forming pad oxide layers 13 in the isolation trenches 14 and the lateral trenches 12 through a thermal oxidation process, as shown in FIG. 8; the pad oxide layers 13 have a thickness of 100 Å~1000 Å.

Figure 9:
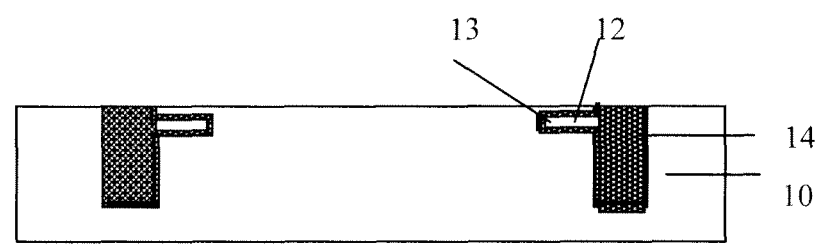
FIG. 9 illustrates the structure after the step 9) of the manufacturing method of an embodiment of the present invention is completed.

9) filling second oxide film into the isolation trenches 14 through an HDP (high density plasma) chemical vapor deposition process, and then removing the nitride film 22 and the bottom oxide layer 21 on the surface of the silicon substrate 10 by wet etching, as shown in FIG. 9.

Figure 10:
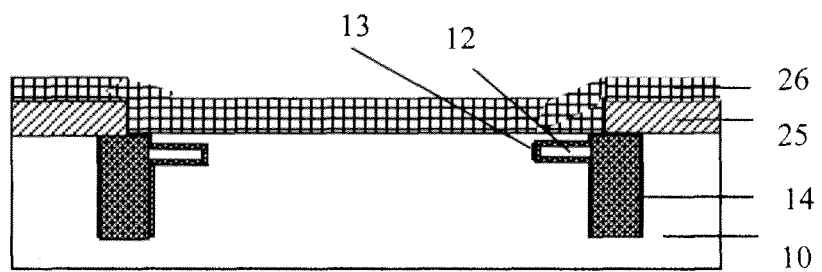
FIG. 10 illustrates the structure after the step 10) of the manufacturing method of an embodiment of the present invention is completed.

10) forming a base window through an ordinary photolithography and etching process to etch a part of a first dielectric film 25 after the dielectric film 25 is grown, and then performing epitaxial deposition of a base SiGe film 26, as shown in FIG. 10.

Figure 11:
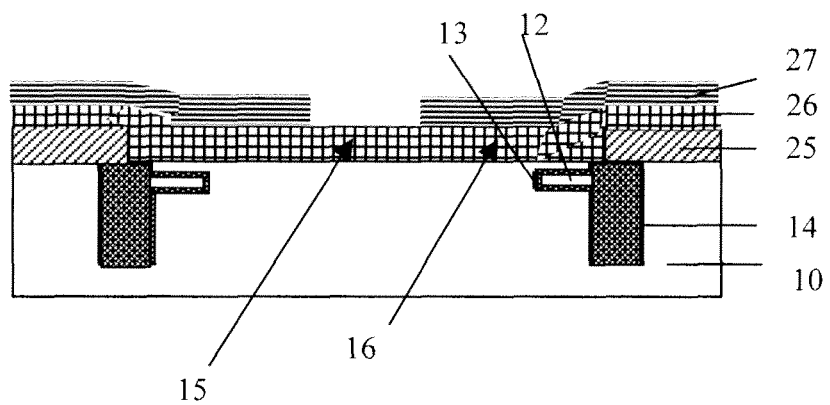
FIG. 11 illustrates the structure after the step 11) of the manufacturing method of an embodiment of the present invention is completed.

11) forming an emitter window through an ordinary photolithography and etching process to etch a part of a second dielectric film 27 after the dielectric film 27 is grown, as shown in FIG. 11; a SiGe intrinsic base region 15 and a SiGe extrinsic base region 16 are formed accompanied with the formation of the emitter window; the SiGe intrinsic base region is a part of the base region at the bottom of the emitter window and the SiGe extrinsic base region is the other parts of the base region excluding the intrinsic base region.

Figure 12:
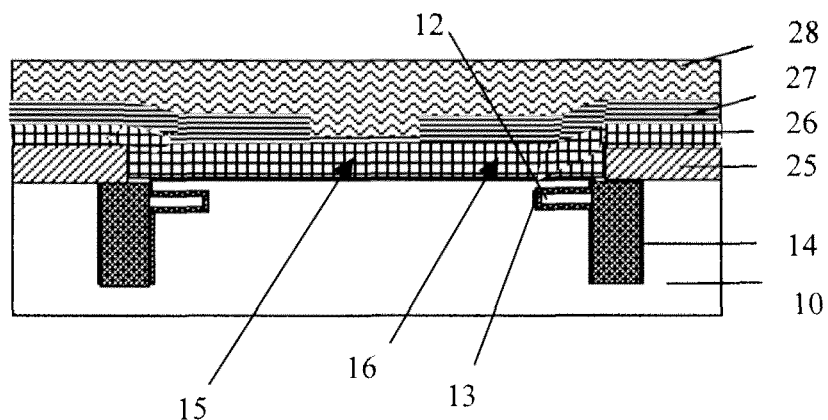
FIG. 12 illustrates the structure after the step 12) of the manufacturing method of an embodiment of the present invention is completed.

12) depositing an emitter polysilicon 28 through an ordinary chemical vapor deposition process, as shown in FIG. 12.

Figure 13:
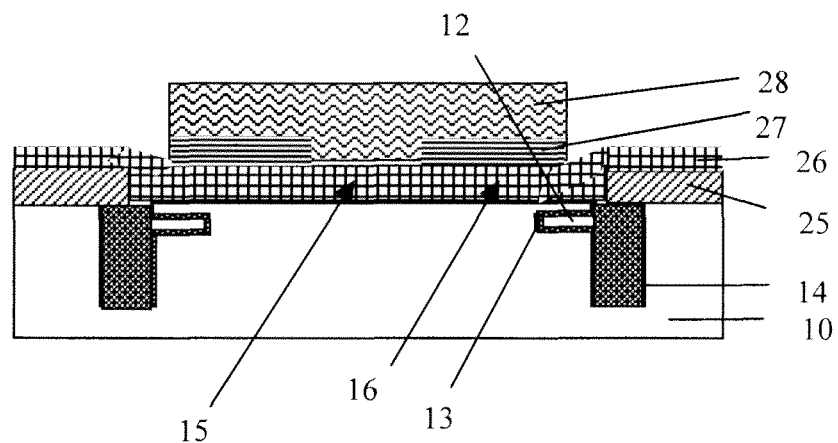
FIG. 13 illustrates the structure after the step 13) of the manufacturing method of an embodiment of the present invention is completed.

13) forming a final SiGe HBT through an ordinary photolithography and etching process to etch parts of the dielectric film 27 and the emitter polysilicon 28, as shown in FIG. 13.

FIG. 13 schematically presents a SiGe HBT having low collector-base capacitance of an embodiment of the present invention, which comprises:

a silicon substrate 10, which comprises a collector region, isolation trenches 14 and lateral trenches 12 situated approximate an extrinsic base region 16, wherein the lateral trenches 12 are filled with a certain amount of oxide film 13 and are not fully filledd with the oxide film 13;

a SiGe base layer (namely the base SiGe film 26 as shown in FIG. 13) formed on the silicon substrate 10; and an emitter region (namely the emitter polysilicon 28 as shown in FIG. 13) formed on the SiGe base layer.

In another embodiment of the present invention, compared to the above embodiment, the lateral trenches 12 are fully filled with oxide film, and correspondingly, the step 9) of the above method should be: filling oxide film into the isolation trenches 14 and lateral trenches 12 through a high density plasma chemical vapor deposition process; then removing the nitride film 22 and bottom oxide layer 21 on the surface of the silicon substrate 10 by wet etching.

The SiGe HBT structure of the present invention has cavities (i.e. the lateral trenches) or cavities filled with a certain amount of oxide film, in vicinity of the SiGe extrinsic base region. The structure can reduce the collector-base capacitance and improve the high-frequency performance of the device, by using the cavities or the cavities filled with a certain amount of oxide film instead of ordinary Si.

What is claimed is:

1. A manufacturing method of a silicon-germanium heterojunction bipolar transistor having low collector-base capacitance, which comprises:
   A) performing ion implantation to predetermined locations in a silicon substrate to form implantation regions;
   B) depositing a bottom oxide layer, a nitride film and a top oxide layer successively on the silicon substrate as hard mask;
   C) forming hard mask windows for trench isolation regions by etching the top oxide layer, the nitride film and the bottom oxide layer;
   D) depositing first oxide film and forming oxide spacers in the hard mask windows through an etch-back process;
   E) forming isolation trenches by dry etching the silicon substrate, each isolation trench being connected to a corresponding one of the implantation regions;
   F) forming lateral trenches by etching the implantation regions;
   G) removing the top oxide layer and the oxide spacers;
   H) forming pad oxide layers in the isolation trenches and the lateral trenches;
   I) filling second oxide film into the isolation trenches and then removing the nitride film and the bottom oxide layer on the surface of the silicon substrate;
   J) depositing a first dielectric film and forming a base window in the first dielectric film, and performing epitaxial deposition of a base SiGe film;
   K) depositing a second dielectric film and forming an emitter window in the second dielectric film;
   L) depositing an emitter polysilicon;
   M) forming a final silicon-germanium heterojunction bipolar transistor by etching the emitter polysilicon.

2. The method according to claim 1, wherein in step A), the ion implantation is performed using arsenic ions with an implantation dose of $7\sim9E15$ cm$^{-2}$.

3. The method according to claim 1, wherein in step A), the implantation regions are below the extrinsic base region of the device; the implantation regions have a width smaller than that of the extrinsic base region and a depth of 0.1 gm-2 gm.

4. The method according to claim 1, wherein in step B), the bottom oxide layer is deposited through a thermal oxidation process with a thickness of 80 Å~200 Å; the nitride film is deposited through a low pressure chemical vapor deposition process with a thickness of 300 Å~1000 Å, 4 times of that of the bottom oxide layer; the top oxide layer is deposited through a low pressure chemical vapor deposition process or sub-atmospheric pressure chemical vapor deposition process with a thickness of 1000 Å~10000 Å.

5. The method according to claim 1, wherein in step D), the thickness of the oxide spacers is 100 Å.

6. The method according to claim 1, wherein in step E), the isolation trenches have a depth of 3000 Å~8000 Å and a width of 1000 Å~4000 Å.

7. The method according to claim 1, wherein in step F), the lateral trenches are formed through hot phosphoric acid wet etching at an etching rate of 20 Å/min~40 Å/min and an etching temperature of 150° C.-170° C.

8. The method according to claim 1, wherein in step G), the top oxide layer and oxide spacers are removed by wet etching.

9. The method according to claim 1, wherein in step H), the pad oxide layers are formed in the isolation trenches and the lateral trenches through a thermal oxidation process, and have a thickness of 100 Å~1000 Å.

10. The method according to claim 1, wherein in step I), the second oxide film is filled into the isolation trenches through a high density plasma chemical vapor deposition process, and then the nitride film and the bottom oxide layer on the surface of the silicon substrate are removed by wet etching.

11. The method according to claim 1, wherein in step K), a SiGe intrinsic base region and a SiGe extrinsic base region are formed accompanied with the formation of the emitter window; the SiGe intrinsic base region is a part of the base region at the bottom of the emitter window and the SiGe extrinsic base region is the other parts of the base region excluding the intrinsic base region.

* * * * *